[19] United States Patent
Parikh et al.

[11] 4,205,200
[45] May 27, 1980

[54] DIGITAL COMMUNICATIONS SYSTEM UTILIZING CONTROLLABLE FIELD SIZE

[75] Inventors: Bipin D. Parikh; Haresh C. Patnaik; Bhagubhai K. Patel, all of Cambridge, Ohio; Prabodh M. Dharia, Des Plaines, Ill.; John J. Kurtz, Cambridge, Ohio

[73] Assignee: NCR Corporation, Dayton, Ohio

[21] Appl. No.: 839,483

[22] Filed: Oct. 4, 1977

[51] Int. Cl.² .............................................. H04J 3/16
[52] U.S. Cl. ...................................... 370/83; 370/91; 370/118
[58] Field of Search .................. 179/15 BA, 15 A, 15 BW, 15 BV

[56] References Cited

U.S. PATENT DOCUMENTS

| 3,207,851 | 9/1965 | Kukinuki | 179/15 BY |
| 3,591,722 | 7/1971 | Palsa | 179/15 BY |
| 3,790,715 | 2/1974 | Inose | 179/15 BV |
| 3,982,074 | 9/1976 | Clark | 179/15 BV |
| 3,988,545 | 10/1976 | Kuemmerle | 179/15 BV |
| 4,071,887 | 1/1978 | Daly | 179/15 BA |
| 4,092,665 | 5/1978 | Saran | 179/15 BW |
| 4,156,798 | 5/1979 | Doelz | 179/15 AL |

Primary Examiner—David L. Stewart
Attorney, Agent, or Firm—J. T. Cavender; Edward Dugas; Stephen F. Jewett

[57] ABSTRACT

A digital communication system employs a technique of effectively controlling the size of the bytes making up a field of data to be serially transmitted from one station to another, particularly one wherein the byte size may be selectively changed during the transmission of the data field. Assembly of a transmitted data field is controlled so that it includes an encoded data byte, termed a first pre-header byte, which contains information as to whether or not a change in the byte size of the data field is to occur. If the first pre-header byte indicates the occurrence of a byte size change, it also will contain a code representative of the size of the change. In addition, for a change in byte size, a second encoded data byte, termed a second pre-header or count byte is generated and immediately follows the first pre-header byte. The count byte contains information which specifies the length of that portion of the data field which precedes the occurrence of the change in byte size. Thereafter, following these pre-header bytes are a number of bytes of a first byte length (usually eight bits), which number is designated by the count byte, succeeded by those data bytes whose size is that specified in the first pre-header byte.

14 Claims, 5 Drawing Figures

FIG. 4B

DIGITAL COMMUNICATIONS SYSTEM UTILIZING CONTROLLABLE FIELD SIZE

FIELD OF THE INVENTION

The present invention relates to a technique of controlling the byte size of data words transmitted in serial format over a bit oriented communication link. In particular, the invention provides a technique of effecting a dynamic byte size change on the communication link.

BACKGROUND OF THE INVENTION

In carrying out communications between processing terminals by way of a bit oriented data link, the data assembly and transmission system should be capable of operating with any desired code character set. The byte size of each code set cannot be changed during the communication, and, as a result, the byte size chosen must be wide enough to accomodate the largest information byte. It goes without saying that adopting such a scheme may create instances wherein unnecessary bits are transmitted as filler for a data byte, conveying no information and slowing down the communication time between stations.

In our copending U.S. patent application Ser. No. 839,548 for Digital Data Communications Adapter, filed on an even date herewith, there is described a new and improved bit oriented data communications system, which may advantageously be employed for the serial transmission of data from one processing terminal to one or more remote processing terminals and which is particularly suitable for transmitting serial data, the byte size of which may be changed, thereby providing a more efficient and rapid communication between terminals.

SUMMARY OF THE INVENTION

The present invention, which is directly applicable to and employed in our above described system, is directed to a technique of effectively controlling the size of the bytes making up a field of data to be serially transmitted from one station to another, particularly one wherein the byte size may be selectively changed during the transmission of the data field. It should be understood that the environment in which the present invention may be employed is not limited to the above referred to system, but may be readily incorporated into a variety of serial format digital data communication networks. For this reason, the description to follow will treat the application of the invention to a general technique of encoding, assembling, decoding, and disassembling a frame of serially transmitted data wherein a change in byte size of the data is to be accommodated on the communication link.

The invention controls the assembly of a data field so that it includes an encoded data byte, termed a first pre-header byte, which contains information as to whether or not a change in the byte size of the data field is to occur. If the first pre-header byte indicates the occurence of a byte size change, it also will contain a code representative of the size of the change. In addition, for a change in byte size, a second encoded data byte, termed a second pre-header or count byte is generated and immediately follows the first pre-header byte. The count byte contains information which specifies the length of the portion of the data field which precedes the occurence of the change in byte size. Thereafter, following these pre-header bytes are a number of bytes of a first byte length (usually eight bits), which number is designated by the count byte, succeeded by those data bytes whose size is that specified in the first pre-header byte.

In accordance with an exemplary implementation of the dynamic change, data to be transmitted is read out from storage, such as a data processing terminal memory, wherein the data has been written for transmission. During loading of the data field in memory, any intended change in byte size is designated by encoding a pair of pre-header data bytes in the manner described above. When data is to be read out from memory for transmission, the memory is addressed and each byte, beginning with the first pre-header byte, is written into a parallel-in, serial-out register in parallel format. The number of stages of the register is sufficient to accommodate the widest byte size of the data to be transmitted. Thus, for a standard eight bits/byte code, an eight stage register loads each bit of a byte to be transmitted and then for serial transmission, each bit stored is read out in sequence, least significant bit first. To accommodate a byte size change in the data stream, the first and second pre-header bytes are stored, for transmission control purposes, in a pair of separate respective registers. In addition, these two bytes are transmitted immediately prior to the data information bytes, for receiver control purposes. The contents of the register containing the count byte are decremented as such standard byte (e.g., eight bits) prior to byte size change, is coupled through the parallel-in, serial-out register. When the contents of the count byte register reach a prescribed number (e.g. zero), a byte size control register, which is coupled to the register storing the first pre-header byte, is caused to store the code designating the new byte size of the data. This new byte size code presets counter circuitry which controls the operation of the parallel-in, serial-out register. The parallel-in, serial-out register will now load only the number of bits supplied on its parallel input lines which cause the counter circuitry to count to capacity and generate a carry. Two's complement logic encoding of selected bits of the first pre-header byte is used so that the number of bits loaded into and read out from parallel-in, serial-out register corresponds to the dynamically changed byte size.

At the receiving terminal, the first and second pre-header bytes are received first since they were transmitted first, and are sequentially stored in respective registers. Selected stages of these registers are coupled to appropriate counter and logic circuitry, whereby the receiving terminal will be informed of the occurrence of a byte size change and the size of the change, so that the sequentially received data bytes may be properly disassembled and stored in memory.

BRIEF DESCRIPTION OF THE DRAWINGS

FIG. 4 consisting of FIGS. 4A and 4B, is a schematic block diagram of receiver terminal circuitry for detecting and decoding a serial data stream to which a dynamic byte size change has been imparted.

DETAILED DESCRIPTION TRANSMITTER CONTROL CIRCUIT

Figure 1:
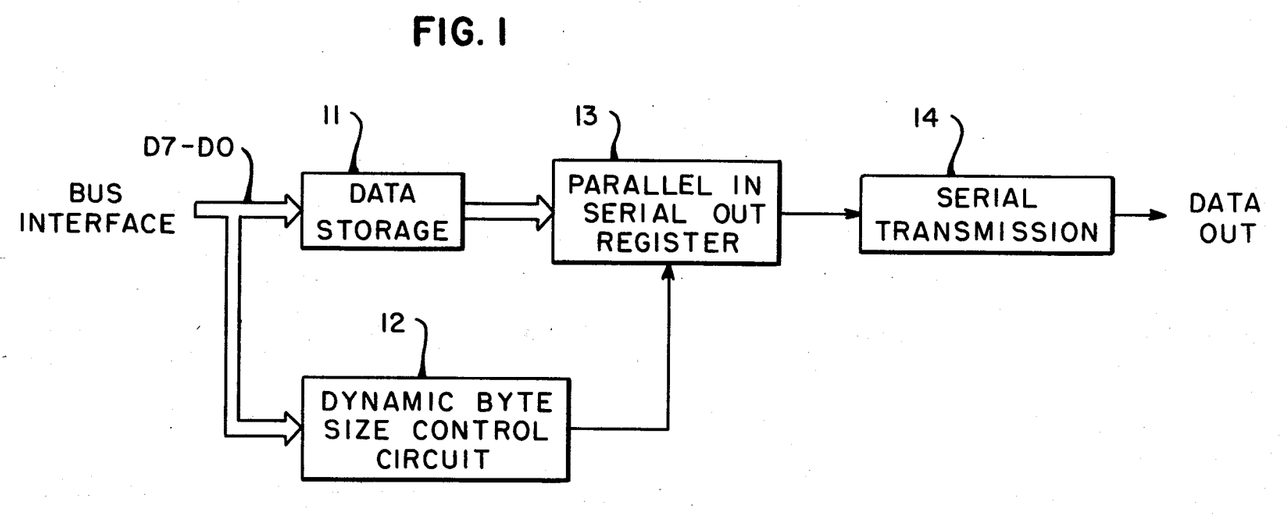
FIG. 1 is a schematic block diagram of a bit oriented data communication link transmitter with dynamic byte size control.

Referring now to FIG. 1, data to be transmitted from one data terminal to another is typically available on the data portion of a bus interface coupled to memory. While FIG. 1 provides an exemplary illustration of an eight bit parallel data line D7–D0, it is to be understood that the invention is not limited to the number of data bits supplied for transmission. The invention is readily adaptable to any terminal equipment whether the data capacity be eight, sixteen, twenty-four, thirty-two, etc., bits.

Prior to transmission, the bits of each byte read out from memory are stored in parallel in a data storage register 11. Eight data bits D7–D0 are supplied in a parallel-in, serial-out register 13 and are sequentially read out for serial transmission (bit-by-bit) via serial transmission circuitry 14. Register 13 has the same number of stages as will accomodate the parallel data bits supplied to it, i.e. eight stages for the example described. Normal operation results in the data being transmitted in eight bit bytes for the eight data bits D7–D0 sequentially supplied in parallel from the bus interface. After one byte is loaded and transmitted, another follows. There may be circumstances, however, where the information being read out of memory and supplied via the bus interface does not require the use of all eight bits, D7–D0, for each data byte. Rather than transmit unnecessary unused bits, which delay transmission time on the communication link as well as subsequent processing time at the receiver terminal, the transmitter of FIG. 1 employs a dynamic byte size control circuit 12 coupled to receive the eight data bits D7–D0, and in response to information contained in initial bytes, termed pre-header bytes, control circuit 12 modifies the operation of parallel-in, serial-out register 13 so that, in effect, only those bits of which a byte is actually composed are serially transmitted. To this end, control circuit 12 monitors the pre-header bytes which contain information as to whether or not a byte size change is to occur, where it is to occur, and what the new byte size will be. This information is stored and, at that point in the data transmission where the byte size change is to take place, control circuit 12 causes register 13 to load only the bits D0–Dx ($3 \leq X \leq 7$) of which the new bytes are to be composed. For example, if there is a byte size change from the normal eight bits/byte to five bits/byte, at the point in the data transmission where the change is to occur, register 13 will load only bits D0–D4 of register 11, since bits D5–D7 contain no useful information. Thus, only bits D0–D4 will be transmitted. A detailed explanation of the constituents of control circuit 12 will be presented below in connection with FIG. 3.

Figure 2:
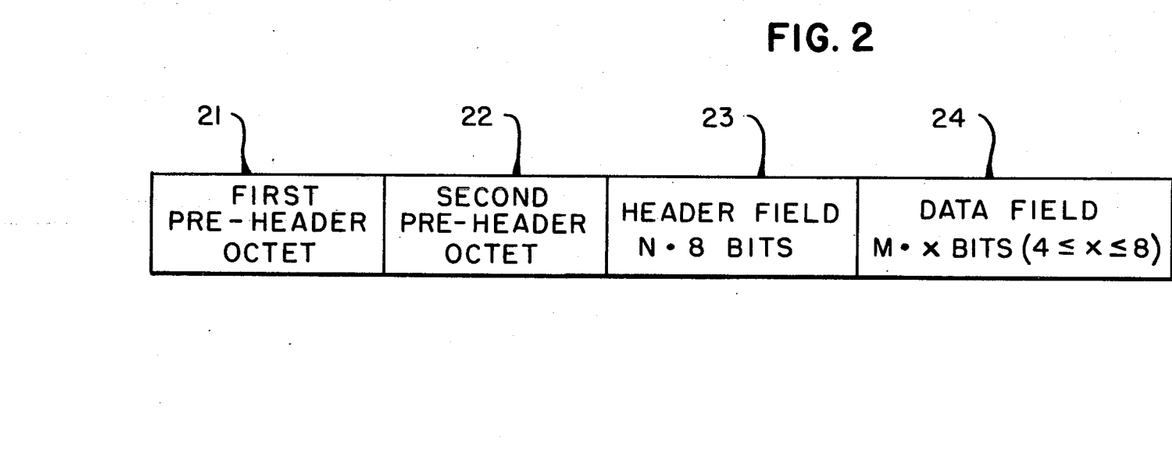
FIG. 2 illustrates the serial components of a field of data.

Control of the operation of dynamic byte size control circuit 12 is effected by an initial set of control bytes, supplied from memory, which preceed the data field. The format of the overall data field including the pre-header bytes which control the operation of the dynamic byte size control circuit is shown in FIG. 2. A first pre-header byte 21 is composed of the eight binary bits D7–D0. Its least significant bit (LSB) D0 represents whether or not a byte size change is to occur in the bytes which follow the pre-header bytes. Where there is to be no byte size change, D0=1 and pre-header byte 1 is followed immediately by the data field 24, each data byte being composed of all eight bits D7–D0. If D0=0, a byte size change is to occur and, moreover, the first pre-header byte is followed by a second pre-header or count byte and a header field preceding the data field. When D0=0, the first pre-header byte also contains information representative of the byte size of the data bytes after the change occurs. This information is contained in selected bits (e.g. D5, D4, D3) of the first pre-header byte, encoded in two's complement binary code. Table 1 below shows such encoding for defining the byte size after the change.

TABLE 1

| (coding of byte size bits D5, D4, D3) | | | |
|---|---|---|---|
| D5 | D4 | D3 | (two's complement) |
| 0 | 0 | 0 | 8 bits/byte |
| 0 | 0 | 1 | 7 bits/byte |
| 0 | 1 | 0 | 6 bits/byte |
| 0 | 1 | 1 | 5 bits/byte |
| 1 | 0 | 0 | 4 bits/byte |

The other bits of first pre-header byte 21 may be used for various indicator functions, a description of which is unnecessary for an understanding of the present invention.

The second pre-header or count byte 22 which may follow the first pre-header byte, depending upon the state of bit D0 of the first pre-header byte, is an eight bit binary code specifying the number of eight-bit bytes which are to follow the count byte 22 before a change in byte size occurs. Following the count byte 22 is a header field of N eight bit bytes, N corresponding to the binary number represented by bits D7–D0 of count byte 22. Byte 23 is then followed by a data field 24 made of M bytes, the bit length of which is defined in the selected bits, D5–D3, of the first pre-header byte 21. Thus, the header may be considered to be that portion of the transmitted data subsequent to the count byte during which there is no departure from the normal eight bits/byte format.

Figure 3:
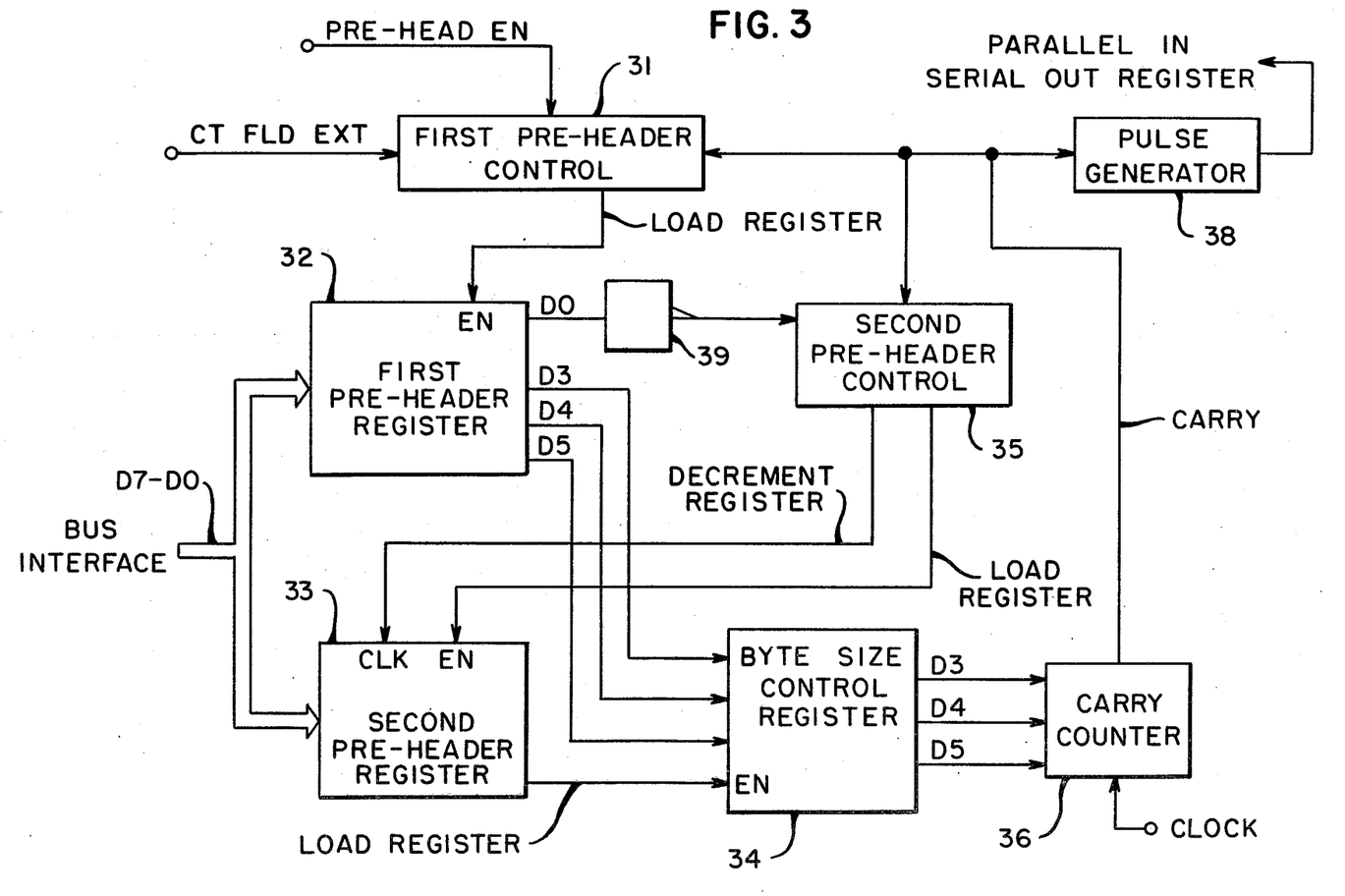
FIG. 3 is a detailed schematic block diagram of the dynamic byte size control circuit of FIG. 1.

Referring now to FIG. 3, wherein the details of the dynamic byte size control circuit 12 are illustrated, the data stream to be transmitted is supplied over parallel bits lines D7–D0 from the bus interface to a pair of pre-header registers 32 and 33. The first pre-header register 32 is controlled by a first pre-header control circuit 31, which responds to appropriate control signals to be described below and selectively enables first pre-header register 32 to store the contents of data lines D7–D0. Similarly, second pre-header register 33, which comprises a down counter, is controlled by a second pre-header control circuit 35, which responds to prescribed input signals, to be described below, and selectively enables register 33 to both load the contents of data lines D7–D0 and subsequently decrement its contents. Specifically, second pre-header control circuit 35 receives input signals from carry counter 36 and from inverter 39 which is coupled to the D0 bit stage of register 32. Byte size control register 34 is coupled to store the contents of the D5, D4, and D3 bit stages of first pre-header register 32, when the contents of the second pre-header register 33 have been decremented to a selected value, e.g. zero, so that an enable output signal is delivered to byte size control register 34 and it stores the two's complement of bits D5, D4, and D3 representing the new byte size of the data stream.

The outputs of the stages of byte size control register 34 are coupled to carry counter 36 which up-counts the binary number supplied on inputs D5, D4, and D3, in accordance with a system clock signal, and generates a carry signal upon recycling at overflow. Because the stages of carry counter 36 are coupled to the outputs of register 34, carry counter will recycle to whatever binary value is contained in bit lines D3, D4, and D5. The carry signal is applied to a pulse generator circuit 38, the output of which is applied to parallel-in, serial-out register 13 (FIG. 2) to control the loading of the contents of the stages of data storage register 11 in register 13. The carry signal is also applied to first pre-header control circuit 31 and second pre-header control circuit 35.

As was described above, an examplary useful environment in which the present invention may be incorporated is that of the digital bit oriented communications adapter described in our above-referred to co-pending application, field on even date herewith. Although the application of the present invention is not limited to that particular environment, for simplifying the description and to provide an exemplary working illustration of its use, the operation of the dynamic byte size control circuit will be described in conjunction with its use in the above-referred to adapter. Preliminary control signals for first pre-header control circuit 31 are coupled from the frame transmission control circuit within the frame multiplexer and from a function register within the pre-transmission control circuit of the adapter described in the above-referred to application. More particularly, a signal for permitting extension of the control field to a length beyond the eight bits described in the above-referred to application is supplied from a function register. In effect, this CT FLD EXT signal inhibits the operation of the dynamic byte size control circuit until the control field, which preceeds the data field, has been completely handled by the system. An enabling signal, PRE HEAD EN, is supplied from the frame multiplexer to initiate the operation of the dynamic byte size control circuit when the information field is ready to be transmitted.

First pre-header control circuit 31 is comprised of straight forward combinational logic which can be readily implemented by one skilled in the art, which logic responds to the input signals in the manner described and selectively enables first pre-header register 32. For this reason, the details of such logic circuitry have not been illustrated, in order to simplify both the drawing and its attendant description.

TRANSMITTER OPERATION

For purposes of description of the overall operation of the circuit shown in FIG. 3, it will be assumed that the data is to contain a change in byte size from the original eight bits/byte format to five bits/byte.

Initially, when the information field is to be transmitted, the first pre-header control circuit 31 will be enabled by a PRE HEAD EN signal (the control field having been completed). After clocking out the previous control field data through register 13, carry counter 36 generates a carry signal so that the next byte of data (in the case, the first pre-header byte of the information field) can be serialized. In response to these signals, first pre-header control circuit 31 generates a load register signal to enable first pre-header register 32, which thereby loads the contents of the data bits D7-D0 from the bus interface. At the same time, these first pre-header bits are being loaded into data storage register 11 (FIG. 1) since the first pre-header byte is part of the data to be transmitted and is necessary for data disassembly at the receiver terminal. In the absence of dynamic control or upon being reset (reset inputs have not been shown in the drawings for purposes of clarity) the contents of register 34 are zeroes so that carry counter 36 counts from (000) through (111) in accordance with its input clock and recycles to (000). Thus, a carry signal is generated every eight bits and the output of pulse generator 38 corresponds to the eight bit length of the data byte, so that all eight parallel bits D7-D0 stored in register 11 are serialized through register 13 for transmission.

The carry signal from carry counter 36, generated as the eighth bit of the first pre-header byte is applied to register 13 via Pulse Generator 38, is applied to first pre-header control circuit 31 and second pre-header control circuit 35. The PRE HEAD EN enabling signal is no longer supplied from frame transmission control circuit (the first pre-header field having been already coupled from the bus interface) so that first pre-header control circuit 31 does not generate another LOAD REG signal which would cause first pre-header register 32 to load the D7-D0 contents of the bus interface. Instead, since the level of the D0 stage of register 32 is a "0", indicating a byte size change, the output of inverter 39 is a "1" which, together with the carry signal, causes a LOAD REG signal to be delivered to the enable input of second pre-header register 33, whereby the contents of data lines D7-D0, which presently contain the second pre-header or count byte, are loaded into the second pre-header register 33. The LOAD REG signal may also internally feed back within control circuit 35 to inhibit further loading of register 33 until the system is reset for a subsequent data frame. Control circuit 35 also contains appropriate combinational logic which generates prescribed control signals in accordance with the input signals applied thereto. Various implementations may be employed by those skilled in the art, and again, for purposes of simplification, the specifics of the logic have not been illustrated in detail. Upon receipt of subsequent carry signals from counter 36, control circuit 35 supplies a DECREMENT REG signal to register 33 to decrement its contents. As was described previously, the contents of register 33 are indicative of the number of bytes subsequent to the second pre-header or count byte during which there is no change in byte size. Thus, carry counter 36 continues to count from (000) to (111) and recycle to (000), generating a carry signal for each eight clock pulses counted and thereby causing parallel-in, serial-out register 13 to load eight bits for the second pre-header byte and each subsequent header byte until there occurs a byte size change.

Upon second pre-header register 33 being decremented to zero, it generates a LOAD REG signal which is supplied to byte size control register 34. Register 34 loads the contents of the D5, D4, and D3 stages of register 32. For the example chosen, i.e. a byte size change to five bits/byte, the contents of these stages of register 32 are, in accordance with Table 1: D5=0, D4=1, and D3=1. Carry counter 36 now begins counting clock pulses from the binary number 011 (i.e. a decimal 3) and generates a carry signal upon recycling from 111 to 011 again. Thus, carry counter 36 generates a carry signal for every five clock pulses counted, rather than for every eight clock pulses as it had previously. The output of pulse generator 38 is now only sufficient to enable parallel-in, serial-out register 13 to load bits D0-D4, i.e. five bits, from data storage register 11. Thus, only five bits per byte will be transmitted to the remote receiver terminal, until completion of the data transmission. Upon completion of transmission of the data field, the system is reset for dynamic control of the data byte size in a subsequent transmission.

RECEIVER CONTROL CIRCUIT

Figure 4A:
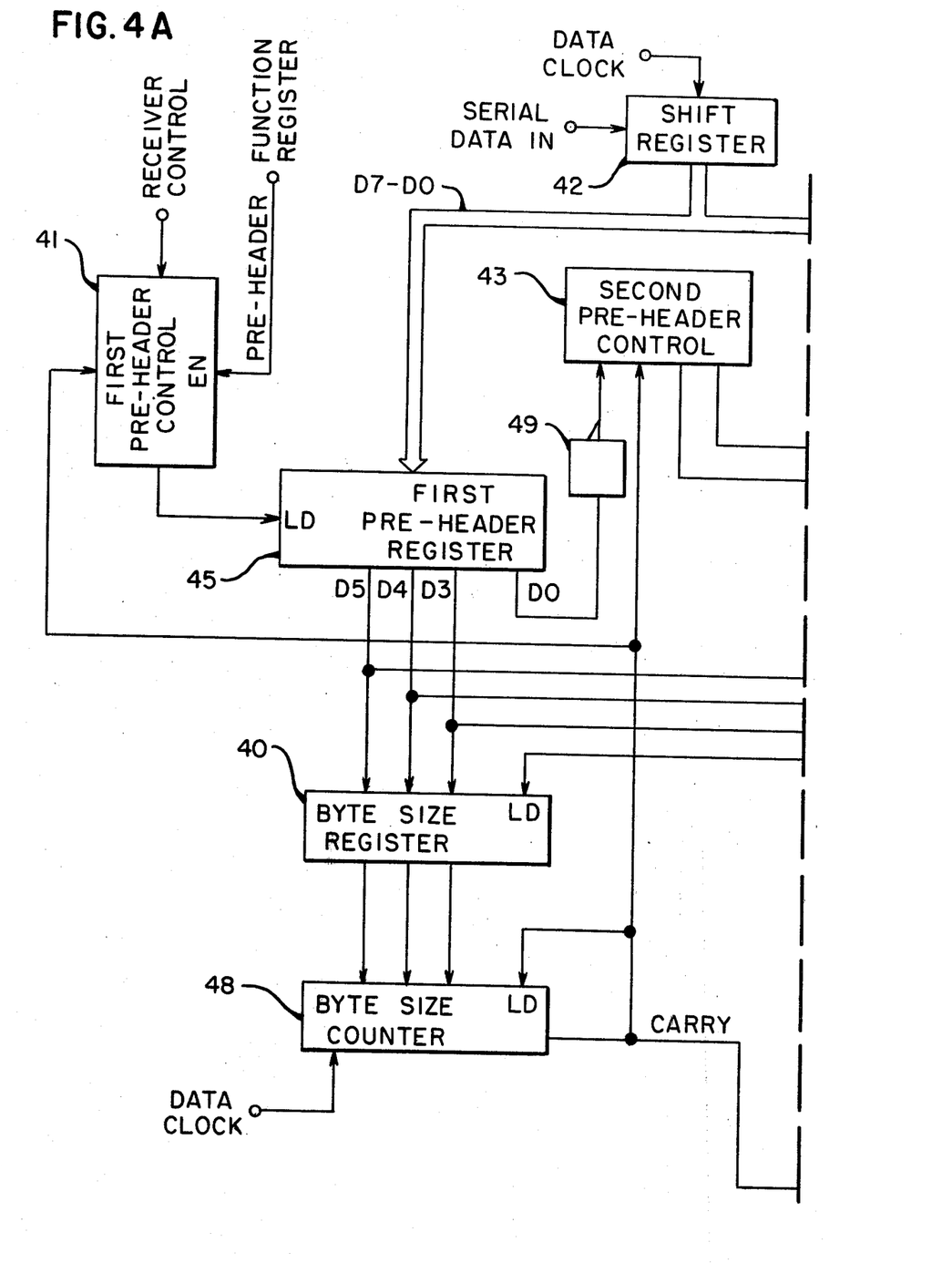
Figure 4B:
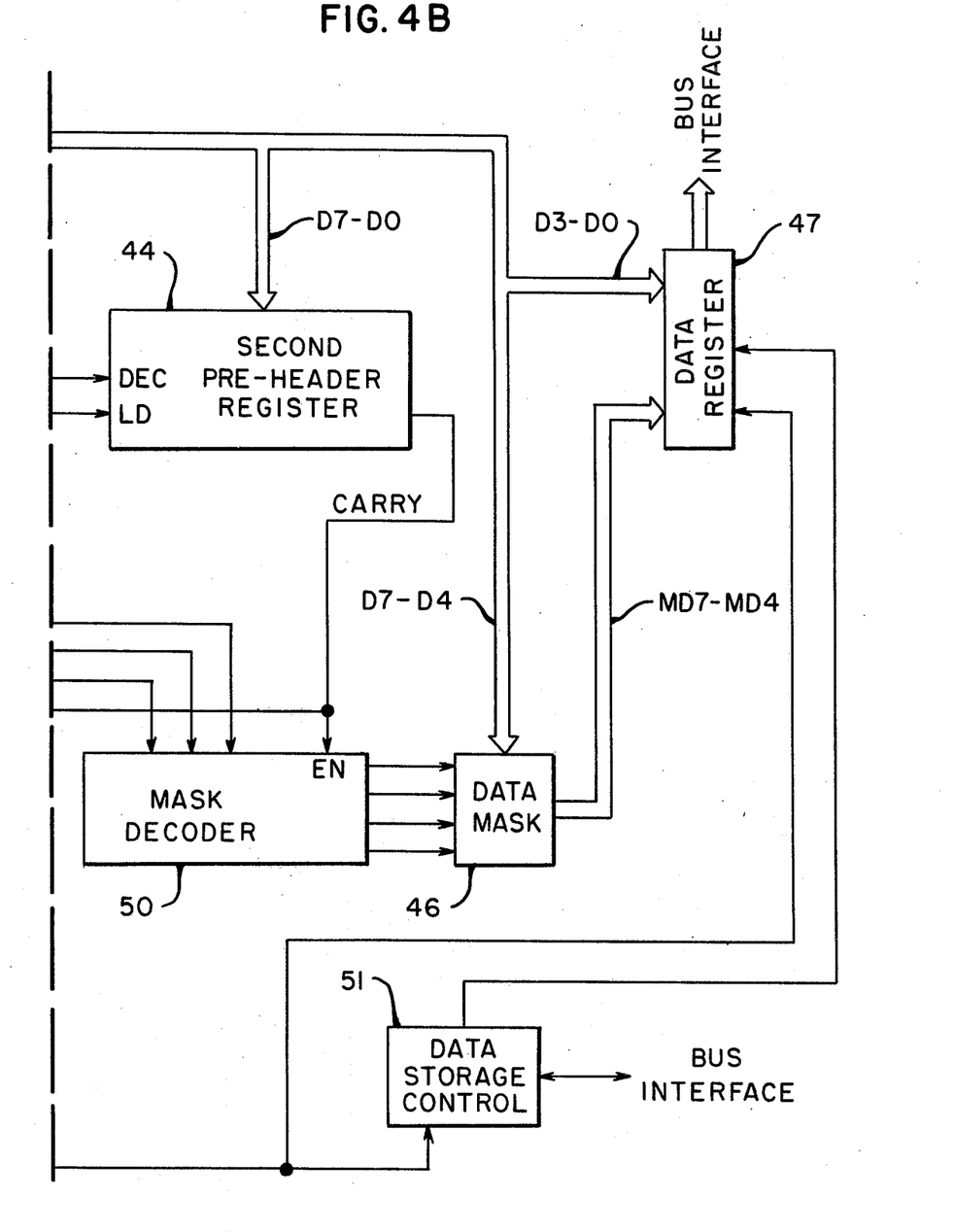

With the data having been transmitted in accordance with the format shown in FIG. 2, there must be provided appropriate detection and decoding circuitry at the receiver terminal so that correct separation and storage of data of different byte sizes can take place. Referring now to FIG. 4, where the receiver terminal circuitry for implementing data decoding is shown, the incoming serial data stream is serially loaded into a serial-in, parallel-out register 42 in accordance with the recovered data clock. Stages D0–D7 of register 42 are coupled in parallel to each of pre-header register 44 and 45, a data mask circuit 46, and a direct memory access (DNA) data register 47. Control of the storage of the data is initially effected from pre-header control circuits 41 and 43. As was the case with the pre-header control circuits 31 and 35 in the dynamic control circuit of the transmitter, shown in FIG. 3, pre-header control circuits 41 and 43 are constructed of appropriate combination logic readily implemented by one skilled in the art to supply prescribed control signals, as will be described below, for controlling the loading of each of the pre-header registers and the decrementing of the contents of the second pre-header register which, like the pre-header register 33 in FIG. 3, is comprised of a down counter. The outputs of the D3, D4, and D5 stages of first pre-header register 45 are coupled to a byte size register 40 and data mask decoder 50. The D3, D4, and D5 contents of first pre-header register 45 are loaded into register 40 upon the generation of a carry output by down-counting register 44. The data mask decoder 50 is also enabled by the carry out register 44 and is connected to data mask 46. Decoder 50 and data mask logic 46 are formed of appropriate combinational logic to decode the two's complement bits D5, D4, D3 and mask any unused bit of each received data byte as maskable bits MD7–MD4 supplied to the DMA data register 47. The D3–D0 stage outputs of register 42, i.e. the unmasked bits, are coupled directly to the four LSB stages of data register 47. The output of data register 47 is connected to the bus interface for delivering the received serial data to memory under control of a data storage control circuit 51 which may be formed of an appropriate DMA control circuit.

For controlling the overall operation of the receiver control circuit, a byte size counter 48, incremented in accordance with the received data clock, is coupled to receive the contents of byte size register 40 and count from the three bit binary number stored therein to (111) and recycle to the binary number supplied from register 40. At each carry, second pre-header control circuit 43 causes register 44 to decrement its contents by one bit and the contents of register 42 are loaded into data register 47 and coupled to memory via the bus interface under control of data storage control 51.

RECEIVER OPERATION

The description of the operation of the receiver terminal circuitry of FIG. 4 will treat the same byte size change example described previously in conjunction with the transmitter circuit of FIG. 3. As serial data is received, it is supplied bit-by-bit to be serially shifted into register 42. (Herein it is assumed that appropriate sync, address, and control bytes have previously been detected and processed so that the receiver control circuitry (not shown) provides a pre-header gating signal to control circuit 41. The PRE HEAD EN signal may be supplied during initialization of the receiver from the appropriate function register). In response to a pre-header enabling or gating signal PRE HEAD EN, first pre-header control circuit 41 causes the first pre-header register 45 to load the contents of the D7–D0 stages of shift register 42. At the same time, the D7–D4 bits of the first pre-header byte are coupled to data mask circuit 46, while the D3–D0 bits are supplied to data register 47 to be stored in memory. Since the first pre-header byte contains eight bits, the data is not masked by circuit 46 and the entire first pre-header byte is stored in memory from register 47.

The D0 bit of the first pre-header byte, which is a "0" indicating the presense of a byte size change, is inverted by inverter 49 and coupled to the second pre-header control circuit 43. Second pre-header control circuit 43, in response to a "1" supplied from inverter 49, indicating the existence of a second pre-header byte to follow, enables second pre-header register 44 so that the second pre-header byte may be stored therein from register 42 upon the next carry from counter 48, which is currently counting from (000) to (111) and recycling. The second pre-header register 44 now contains an eight bit binary representation of the number of subsequent bytes for which there is no change in byte size. As byte size counter 48 counts from (000) to (111) and recycles, it generates a carry signal which is coupled to pre-header control circuit 43. At the first carry from counter 48 after loading the second pre-header register 44 with the second pre-header or count byte, control circuit 43 begins causing register 44 to count down, via a decrement signal DEC. As register 44 counts down, each eight bit byte of the header field is coupled from register 42 to register 47 (unmasked as yet by data mask 46) and supplied to memory via data storage control 51.

Upon being decremented to zero, register 44 generates a carry signal. This carry signal causes the contents of the selected stages D5, D4, and D3 of the first pre-header register 45, wherein the new byte size code is stored, to be loaded into register 40. Also, mask decoder 50 is enabled to decode the D5, D4, and D3 bits and cause data mask logic 46 to begin masking those D7–D4 bits in register 42 which are not part of the new bytes. Counter 48 now begins counting from (011) through (111) and generates a carry upon recycling to the value of the contents of the stages of register 40 (i.e. 011). Since both counter 48 and register 42 are each clocked in synchronism by the data clock, five new data bits will have been shifted into register 42 each time counter 48 generates a carry. Accordingly, the four LSBs (D3–D0) and the D4 bit of register 42 corresponding to these five new bits making up a data byte are supplied to data register 47 unmasked. However, data mask logic 46 masks the D7, D6, and D5 bits, which remain in register 42 from the previous byte, so that the new five bit byte is correctly stored in register 47 and coupled to memory via data storage control 51. Upon completion of disassembly of a received data frame, the receiver control circuitry will cause appropriate resetting of the dynamic byte control circuitry of FIG. 4 so that it will be ready to receive and control the disassembly of subsequent transmissions.

As will be appreciated from the foregoing description, incorporation of the present invention into a bit oriented digital communication system provides a simplified technique of increasing the rate of data transmission and recovery where data bytes of variable size are employed. Dynamic control of data byte size is especially desired where a plurality of terminals have a common serial data highway and transmission time over the highway should be both efficient in that unused bits are not transmitted and so that frame transmission time between terminals can be reduced.

While we have shown and described one embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. In a digital data communications system wherein data is assembled from its constituent bytes at a transmitter terminal, serially transmitted, and disassembled into its constituent bytes at a receiver terminal, a method of controlling the byte size of the data serially transmitted from said transmitter terminal and received at said receiver terminal without the use of filler bits, comprising the steps of:
   at the transmitter terminal,
   generating a first byte which contains information as to whether there is to occur a change in the size of data bytes transmitted, and the size of the data bytes transmitted subsequent to the change,
   generating a second byte which contains information representative of the number of data bytes to be transmitted prior to the change in byte size, and
   transmitting said first and second bytes followed by the bytes of the data field to be transmitted, and
   at the receiver terminal,
   receiving the first and second bytes transmitted from said transmitter,
   decoding the information contained in said first and second bytes relative to the size of the bytes of the data field, and
   receiving said data field and disassembling said data field into the bytes of which it is composed in accordance with said decoding step.

2. A method according to claim 1, further comprising the steps of:
   at said transmitter terminal,
   storing said first and second bytes,
   modifying said stored second byte while assembling and transmitting said number of data bytes, and
   upon the information contained in said modified second byte being modified to represent a prescribed value, assembling and transmitting the remainder of said data field in bytes the size of each of which is specified in said stored first byte.

3. A method according to claim 1, further comprising the steps of:
   at said receiver terminal,
   storing said first and second bytes as they are received,
   modifying said stored second byte while receiving and disassembling said received data field into bytes the size of each of which corresponds to that in each of said number of data bytes, and
   upon the information contained in said stored second byte being modified to represent a preselected value, disassembling the remainder of the received data field into bytes the size of each of which is specified in the stored first byte.

4. In a digital data communication network wherein data is assembled from its constituent bytes at a transmitter terminal, serially transmitted, and disassembled into its constituent bytes at a receiver terminal without the use of filler bits, a system for controlling the byte size of the data serially transmitted from said transmitter terminal and received at said receiver terminal, comprising:
   at said transmitter terminal,
   first means for storing a first byte which contains information as to whether there is to occur a change in the size of data bytes of a transmitted data field, and the size of the data bytes transmitted subsequent to the change,
   second means for storing a second byte which contains information representative of the number of data bytes to be transmitted prior to the change in byte size,
   third means, coupled to said first and second means, for transmitting said first and second bytes and the data field, and
   fourth means, coupled to said first, second, and third means, for causing said third means to transmit said number of data bytes while modifying the contents of said second means, and upon the contents of said second means being modified to reach a prescribed value, causing said third means to transmit the remainder of said data field in bytes the size of each of which is specified in the first byte stored in said first means.

5. A system according to claim 4, further comprising, at said receiver terminal,
   fifth means for sequentially receiving the bits of the first and second bytes and the data field transmitted by said third means,
   sixth means, coupled to said fifth means, for storing said first byte received by said fifth means,
   seventh means, coupled to said fifth means, for storing said second byte received by said fifth means, and
   eighth means, coupled to said fifth, sixth, and seventh means, for successively reading out the contents of said fifth means as said respective number of data bytes while modifying the contents of said seventh means and, upon the contents of said seventh means being modified to read a preselected value, reading out the contents of said fifth means for the remainder of the received data field in bytes the size of each of which is specified in the first byte stored in said sixth means.

6. A system according to claim 5, wherein said fifth means comprises a shift register, the number of stages of which is sufficient to accomodate the storage of any sized data byte serially received from said transmitter terminal, and said eighth means comprises means, coupled to the output of each of the stages of said shift register for controllably masking the outputs of the stages of said shift register in accordance with the contents of said sixth means upon the contents of said seventh means reaching said preselected value.

7. A system according to claim 6, wherein said eighth means further includes a controlled counting circuit, coupled to said sixth means, for receiving the byte size information stored therein as an encoded digital number, the contents of said controlled counting circuit being incremented from said encoded digital number until said counting circuit reaches its maximum storage capacity and recycles, generating a carry signal upon recycling, said carry output signal causing the read out of the contents of said fifth means.

8. A system according to claim 7, wherein said seventh means comprises a down-counting register for storing said second byte and being coupled to said controlled counting circuit so that the digital value of said second byte is decremented upon each carry signal from said controlled counting circuit until the digital value stored in said down-counting register reaches said preselected value, and wherein said eighth means includes means, responsive to the contents of said down-counting register reaching said preselected value, for causing the encoded digital number stored in said sixth means to be loaded into said controlled counting circuit.

9. A system according to claim 4, wherein said third means includes a first register, the number of stages of which is sufficient to accomodate the storage of any sized data byte to be transmitted, and said fourth means includes a controlled pulse generator circuit, the output of which is controlled in according with said first and second means, for causing only those stages of said first register which are necessary to load the respective bytes of a frame of data to be transmitted to be loaded with the bits of which each respective data byte is composed.

10. A system according to claim 9, wherein said fourth means further includes a controlled counter circuit, coupled to said first means, for receiving the information stored therein, representative of the size of the data bytes to be transmitted subsequent to a change in the byte size as an encoded digital value, the contents of said controlled counter circuit being incremented from said encoded digital value until said counter circuit reaches its maximum storage capacity and recycles, generating a carry signal upon recycling, said carry signal controlling the output of said pulse generator circuit.

11. A system according to claim 10, wherein said second means comprises a decrementable register for storing said second byte and being coupled to said controlled counter circuit so that the digital value of said second byte is decremented upon each carry signal from said controlled counter circuit until the digital value stored in said decrementable register reaches said prescribed value, and wherein said fourth means includes means, responsive to the contents of said decrementable register reaching said prescribed value, for causing the encoded digital value stored in said first means to be loaded into said controlled counter circuit.

12. A system according to claim 11, wherein said fifth means comprises a shift register, the number of stages of which is sufficient to accomodate the storage of any sized data byte serially received from said transmitter terminal, and said eighth means comprises means, coupled to the output of each of the stages of said shift register for controllably masking the outputs of the stages of said shift register in accordance with the contents of said sixth means upon the contents of said seventh means reaching said preselected value.

13. A system according to claim 12, wherein said eighth means further includes a controlled counting circuit, coupled to said sixth means, for receiving the byte size information stored therein as an encoded digital number, the contents of said controlled counting circuit being incremented from said encoded digital number until said counting circuit reaches its maximum storage capacity and recycles, generating a carry signal upon recycling, said carry output signal causing the read out of the contents of said fifth means.

14. A system according to claim 13, wherein said seventh means comprises a down-counting register for storing said second byte and being coupled to said controlled counting circuit so that the digital value of said second byte is decremented upon each carry signal from said controlled counting circuit until the digital value stored in said down-counting register reaches said preselected value, and wherein said eighth means includes means, response to the contents of said down-counting register reaching said preselected value, for causing the encoded digital number stored in said sixth means to be loaded into said controlled counting circuit.

* * * * *